(12) United States Patent
Ho et al.

(10) Patent No.: US 12,712,004 B2
(45) Date of Patent: Aug. 18, 2026

(54) AP-PINNED DATA STORAGE LAYER AND LAMINATED TOPOLOGICAL HEUSLER ALLOY SOT-MRAM UNIT CELL FOR IN-MEMORY COMPUTING ARTIFICIAL INTELLIGENCE INFERENCE CHIP

(71) Applicant: Aurora Micro Devices LLC, Emerald Hills, CA (US)

(72) Inventors: Kuok San Ho, Mountain Ranch, CA (US); Ming Jiang, San Jose, CA (US)

( * ) Notice: Subject to any disclaimer, the term of this patent is extended or adjusted under 35 U.S.C. 154(b) by 83 days.

(21) Appl. No.: 18/633,153

(22) Filed: Apr. 11, 2024

(65) Prior Publication Data

US 2025/0322862 A1 Oct. 16, 2025

(51) Int. Cl.

| | |
|---|---|
| ***G11C 11/00*** | (2006.01) |
| ***G11C 11/16*** | (2006.01) |
| ***H10B 61/00*** | (2023.01) |
| ***H10N 50/01*** | (2023.01) |
| ***H10N 50/10*** | (2023.01) |
| ***H10N 50/85*** | (2023.01) |
| ***H10W 20/41*** | (2026.01) |
| ***H10W 20/42*** | (2026.01) |

(52) U.S. Cl.
CPC ...... *G11C 11/1675* (2013.01); *G11C 11/1673* (2013.01); *H10B 61/20* (2023.02); *H10N 50/01* (2023.02); *H10N 50/10* (2023.02); *H10N 50/85* (2023.02); *H10W 20/42* (2026.01); *H10W 20/435* (2026.01)

(58) Field of Classification Search
CPC ............. G11C 11/1675; G11C 11/1673; H01L 11/1673; H01L 23/5226
See application file for complete search history.

(56) References Cited

U.S. PATENT DOCUMENTS

| | | | |
|---|---|---|---|
| 11,145,347 B1 * | 10/2021 | Chiang | H10B 61/10 |
| 2020/0006637 A1 * | 1/2020 | Gosavi | H10N 50/85 |
| 2024/0324468 A1 * | 9/2024 | Chen | H01L 23/5283 |

* cited by examiner

*Primary Examiner* — Pho M Luu

(57) ABSTRACT

An apparatus and a fabricating method therefor of magnetic in-memory computing AI inference chips utilizing magnetic Topological SOT-TMJ array unit cells comprises a spin orbit torque (SOT) cell having laminated Topological half Heusler Alloy layer, a magnetic tunnel junction (MTJ) cell having AP-pinned data storage layer, and a fabricating method therefor comprising materials and manufacturable processes providing a Topological SOT-MTJ having adjustable MTJ junction process and junction shape, wherein the SOT Topological layer and MTJ data storage layer are configured to generate memory writing, the MTJ TMR data storage layer/MgO/pin layer is configured to provide memory reading, and together a non-volatile memory SOT-MTJ array is formed to store programmable weight matrices for efficient AI in-memory computation.

16 Claims, 3 Drawing Sheets

Metal Line Layer
T3
Cap/BL
PMA
PL2
Ru
PL1
MgO
SL2
Ru
SL1
Seed/BL
Side Stress/Isolation Layer
SOT THHA
Seed/BL
SOT THHA
Seed/BL
T1
Metal Line Layer
T2
CMOS Metal Line Layer
T3
Cap/BL
AFM
PL2
Ru
PL1
MgO
SL2
Ru
SL1
Seed/BL
SOT THHA
Seed/BL
T1
Metal Line Layer
T2
CMOS

Metal Line Layer
T3
Cap/BL
PMA
PL2
Ru
PL1
MgO
SL2
Ru
SL1
Seed/BL
Side Stress/Isolation Layer
SOT THHA
Seed/BL
SOT THHA
Seed/BL
T1
Metal Line Layer
T2
CMOS

AP-PINNED DATA STORAGE LAYER AND LAMINATED TOPOLOGICAL HEUSLER ALLOY SOT-MRAM UNIT CELL FOR IN-MEMORY COMPUTING ARTIFICIAL INTELLIGENCE INFERENCE CHIP

CROSS REFERENCE TO RELATED APPLICATIONS

Not Applicable.

STATEMENT RE: FEDERALLY SPONSORED RESEARCH/DEVELOPMENT

Not Applicable.

BACKGROUND

Field of the Disclosure

The various aspects and embodiments described herein generally relate to a magnetic in-memory computing artificial intelligence inference chip utilizing Topological Heusler alloy SOT-MRAM array and a method of manufacturing processes and materials therefor.

Description of the Related Art

Topological insulators (TI) have been proposed for magnetoresistive random access memory (SOT-MTJ MRAM) utilizing the tunneling magnetoresistance (TMR) effect for reading data and the spin orbit torque (SOT) effect for writing data. However, a significant reliability and performance challenge arises from: (1) large demagnetization in the MTJ data storage layer, which leads to degradation of the written bit over time, particularly at high bit densities. Additionally, poor signal-to-noise ratio (SNR) during read-back operations further exacerbates the performance limitations. (2) low operating temperature in TI SOT due to the low melting point of Topological insulators material. The limitations render difficulties in the manufacturing of a large array of topological based unit cells.

To enhance the long-term and thermal reliability while retains large read-back SNR, at high operating temperature of Topological-based AI inference devices, there are pressing needs to drastically reduce the demagnetization field of the storage layer in the unit cell, and to significantly improve TI material melting point in SOT cell. This can be achieved through the utilization of an anti-parallel pinned storage layer in conjunction with the deployment of Topological Half Heusler Alloy (THHA) materials and further doping or cluster co-depositing with ceramic elements including nitride, carbide, and oxide, or doping or cluster co-depositing with inert gases including N2, CO2, and O2.

The implementation of an anti-parallel pinned (AP-pinned) storage layer serves to enhance long-term reliability and SNR ratio by mitigating the demagnetization field effects on the written bit, thereby reducing the occurrence of zigzag magnetic domains. Complementarily, the incorporation of THHA materials, and further doping or cluster co-depositing with ceramic elements including nitride, carbide, and oxide, or doping or cluster co-depositing with inert gases including N2, CO2, and O2, and furthermore with laminated THHA multilayer material structures offer increased thermal stability margins and elevated performance at high temperatures. These advancements are particularly crucial in the context of high-volume manufacturing and hold the potential to improve reliability and substantially reduce the overall costs associated with AI device production.

SUMMARY OF THE DISCLOSURES

The present disclosure generally relates to magnetic Topological Heusler Alloy SOT-MTJ unit cell comprising the MTJ cell having AP-pinned data storage layer and the SOT cell having laminated Topological Heusler Alloy multilayer, utilized for an in-memory computing AI inference chip, and a method of manufacturing processes and materials therefor.

In an aspect disclosed herein, an apparatus and a fabricating method therefor of the magnetic Topological SOT-MTJ array unit cell for deploying magnetic in-memory computing AI inference chip may comprise a spin orbit torque (SOT) cell configured from Topological seed/blocking layer and SOT Topological layer, wherein the SOT Topological layer may include but not limited to a Topological half Heusler alloy (THHA) or a Topological insulator (TI) or a mixture of THHA and TI layer; a magnetic tunnel junction (MTJ) cell configured from tunneling magnetoresistance (TMR) stack of seed layer/data storage layer/MgO/pin layer/Ru/pin layer/AFM/cap layer; and a fabricating method therefor comprising materials and manufacturable processes providing a SOT-MTJ cell configured the MTJ cell having AP-pinned data storage layer and adjustable MTJ junction shape, and the SOT cell having laminated multilayer stack of Topological seed/blocking layer and Topological layer, wherein the SOT layer and MTJ data storage layer are configured to generate memory writing; the MTJ TMR is configured to provide memory reading; and together a magnetic chip comprising SOT-MTJ cells configuring a non-volatile memory array to store a corresponding programmable weight matrix provides efficient AI in-memory computation.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 3 is a schematic illustration of a cross-sectional view of an exemplary embodiment of a SOT MRAM Unit Cell having AP-Pinned Data Storage Layer and RIE Process Stop at MgO Layer.

FIG. 4 is a schematic illustration of cross-sectional view of an exemplary embodiment of a SOT MRAM Unit Cell having Side Gap Layer providing Side Stress and Isolation.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figures 1, 2:
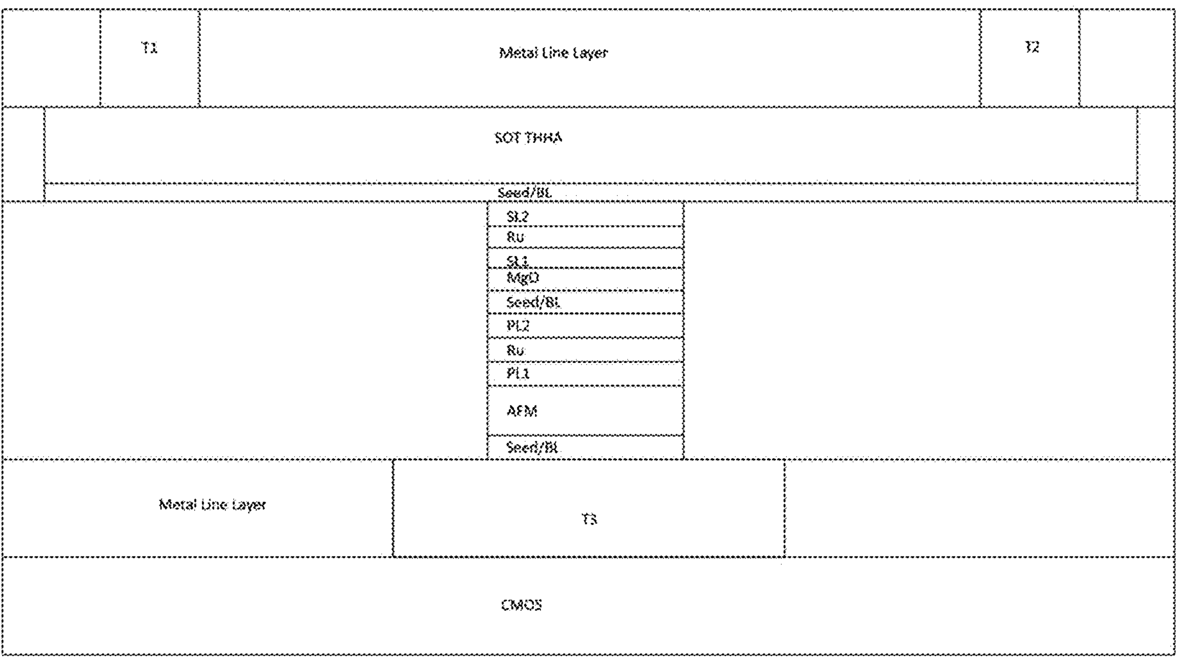
FIG. 1 is a schematic cross-sectional view of an exemplary embodiment of a THHA SOT on-top MRAM Unit Cell having AP-Pinned Data Storage Layer MTJ.
FIG. 2 is a schematic illustration of cross-sectional view of an exemplary embodiment of a THHA SOT on-bottom MRAM Unit Cell having AP-Pinned Data Storage Layer MTJ.

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

Embodiments of the present disclosure generally relate to an apparatus and a fabricating method therefor of the magnetic Topological SOT-MTJ array unit cell for deploying magnetic in-memory computing AI inference chip comprising a spin orbit torque (SOT) cell configured from Topological seed/blocking layer and SOT Topological layer, wherein the SOT Topological layer includes but not limited to a Topological half Heusler alloy (THHA) or a Topological insulator (TI) or a mixture of THHA and TI layer; a magnetic tunnel junction (MTJ) cell configured from tunneling magnetoresistance (TMR) stack of seed layer/data storage layer/MgO/pin layer/Ru/pin layer/AFM/cap layer; and a fabricating method therefor comprising materials and manufacturable processes providing a SOT-MTJ cell configured the MTJ cell having AP-pinned data storage layer and adjustable MTJ junction shape, and the SOT cell having laminated multilayer stack of Topological seed/blocking and Topological layer, wherein the SOT layer and MTJ data storage layer are configured to generate memory writing; the MTJ TMR is configured to provide memory reading; and together a magnetic chip comprising SOT-MTJ cells configuring a non-volatile memory array to store a corresponding programmable weight matrix provides AI in-memory computing.

The implementation of an anti-parallel pinned (AP-pinned) storage layer serves to enhance long-term reliability and SNR ratio by mitigating the demagnetization field effects on the written bit, thereby reducing the occurrence of zigzag magnetic domains. Complementarily, the incorporation of THHA materials, and further with doping of the ceramic elements including nitride, oxide, and carbide, and furthermore with laminated THHA multilayer material structures offer increased thermal stability margins and elevated performance at high temperatures. These advancements are particularly crucial in the context of high-volume manufacturing and hold the potential to improve reliability and substantially reduce the overall costs associated with AI device production.

FIG. 1 is a schematic cross-sectional view of an exemplary embodiment of a THHA SOT on-top MRAM Unit Cell having AP-Pinned Data Storage Layer MTJ. A method of fabricating a SOT-MTJ cell configuring a corresponding magnetic in-memory computing AI inference chips of an exemplary embodiment comprising: providing a TMR full film deposition having seed layer/AFM/pin layer1/Ru/pin layer2/blocking layer/MgO/data storage layer/cap layer, wherein data storage layer has an anti-parallel pinned (AP-pinned) data storage layer1/Ru/data storage layer2; providing a TMR MTJ hard mask including hard mask patterning through lithography and RIE; providing a MTJ patterning Ion Mill, through pin layer/MgO/data storage layer; providing a dielectric material refill, CMP with CMP Stop Layer, and Ion Mill with End Point to final cap surface; providing a Topological THHA SOT layer including Topological seed/blocking layer (Seed/BL) deposition, Topological layer THHA full film deposition, patterning through lithography and Ion Mill, dielectric film refill, and CMP.

FIG. 2 is a schematic illustration of cross-sectional view of an exemplary embodiment of a THHA SOT on-bottom MRAM Unit Cell having AP-Pinned Data Storage Layer MTJ. A method of fabricating a SOT-MTJ cell configuring a corresponding magnetic in-memory computing AI inference chips of an exemplary embodiment comprising: providing a Topological THHA SOT layer including Topological seed/blocking layer (Seed/BL) deposition, Topological layer THHA full film deposition, patterning through lithography and Ion Mill, dielectric film refill, and CMP; providing a MTJ TMR full film deposition having seed layer/data storage layer/MgO/pin layer1/Ru/pin layer2/AFM/cap layer, wherein data storage layer has an anti-parallel pinned (AP-pinned) data storage layer1/Ru/data storage layer2; providing a TMR MTJ hard mask including hard mask patterning through lithography and RIE; providing a MTJ patterning Ion Mill, through data storage layer/MgO/pin layer; providing a dielectric material refill, CMP with CMP Stop Layer, and Ion Mill with End Point to final cap surface.

Figures 3, 4:
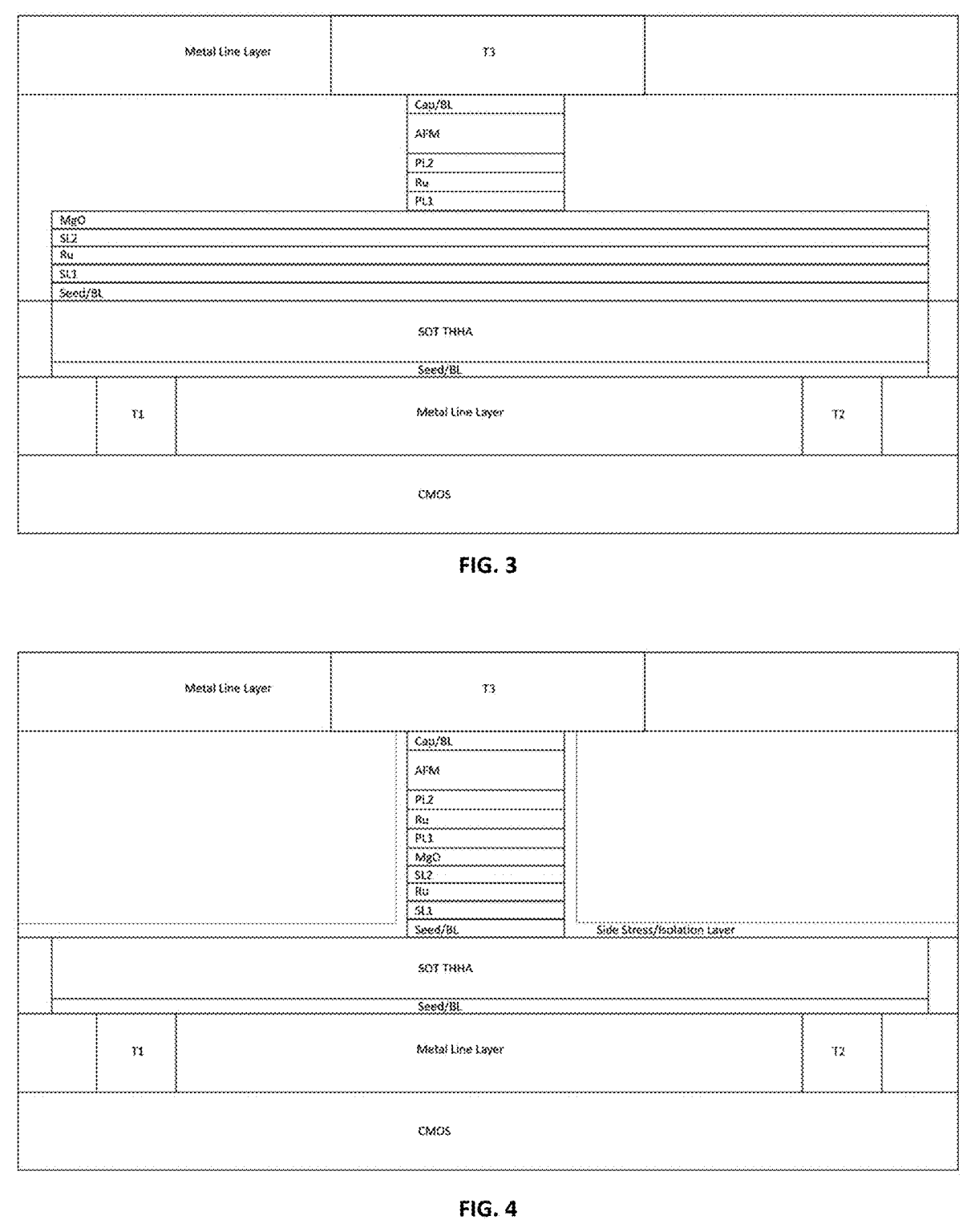

FIG. 3 is a schematic illustration of a cross-sectional view of an exemplary embodiment of a THHA SOT MRAM Unit Cell having AP-Pinned Data Storage Layer and RIE Process Stop at MgO Layer. A method of fabricating a SOT-MTJ cell configuring a corresponding magnetic in-memory computing AI inference chips of an exemplary embodiment comprising: providing a Topological THHA SOT layer including Topological seed/blocking layer (Seed/BL) deposition, Topological layer THHA full film deposition, patterning through lithography and Ion Mill, dielectric film refill, and CMP; providing a MTJ TMR full film deposition having seed layer/data storage layer/MgO/pin layer1/Ru/pin layer2/AFM/cap layer, wherein data storage layer which is data storage layer having an anti-parallel pinned (AP-pinned) data storage layer1/Ru/data storage layer2; providing a TMR MTJ hard mask including hard mask patterning through lithography and RIE; providing a MTJ patterning RIE and stop on MgO; providing a data storage layer length patterning through lithography and Ion Mill, wherein the data storage layer length is not aligned with the pin layer length; providing a dielectric material refill, CMP with CMP Stop Layer, and Ion Mill with End Point to final cap surface.

In one exemplary embodiment, each corresponding magnetic data storage layer comprises synthetic antiferromagnetic (SAF) anti-parallel (AP-pinned) data storage layer of an exemplary embodiment comprising CoFe/Ru/CoFe, CoFe/W/CoFe, CoFeB, CoFe/NiFe, Ta, MgO, W, CoHf, or combination and SAF.

In another exemplary embodiment, each corresponding MTJ cell comprises tunneling magnetoresistance (TMR) stack of an exemplary embodiment of seed layer/data storage layer1/Ru/data storage layer2/MgO/pin layer1/Ru/pin layer2/AFM/cap layer comprising: AFM comprises PtMn, IrMn, FeMn, CoPt, or combination; pin layer PL1/pin layer PL2 comprises CoFeB, CoFe/NiFe, Ta, CoHf, or combination; Ru thickness comprises 2-10 A; data storage layer SL1/data storage layer SL2 providing magnetic data storage comprises CoFeB, CoFe/NiFe, Ta, MgO, W, CoHf, CoFe/Ru/CoFe, CoFe/W/CoFe or combination and SAF; MgO Barrier layer comprises crystalline orientation (001), thickness 2-40 A, and device resistant 100-1000 Ohm; cap/seed/blocking layer (BL) providing texture and blocking diffusion to improve TMR ratio and Topological Hall effect comprises Ta, Ru, Zr, Al, Ni, Co, Hf, MgO, or combinations thereof.

FIG. 4 is a schematic illustration of cross-sectional view of an exemplary embodiment of a THHA SOT MRAM Unit Cell having Side Gap Layer providing Side Stress and Isolation of an exemplary embodiment comprising MgO, $Al_2O_3$, SiC, $Si_3N_4$, $SiO_2$, SiOxNy, $HfO_2$.

Figures 5, 6:
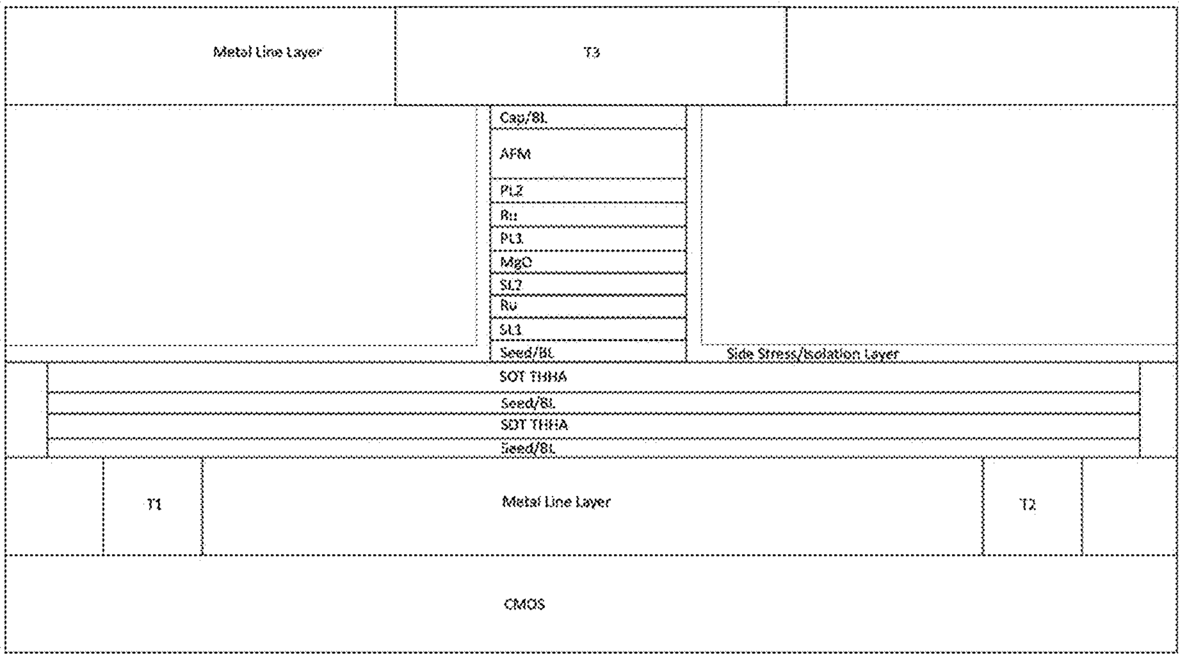
FIG. 5 is a schematic illustration of cross-sectional view of an exemplary embodiment of a SOT MRAM Unit Cell having laminated THHA multilayer SOT cell.
FIG. 6 is a schematic illustration of cross-sectional view of an exemplary embodiment of a SOT MRAM Unit Cell having PMA MTJ.

FIG. 5 is a schematic illustration of cross-sectional view of an exemplary embodiment of a THHA SOT MRAM Unit Cell having laminated Topological multilayer SOT cell comprising Topological seed/blocking layer (Seed/BL) and Topological layer (SOT THHA, wherein the stack repeats one or more times.

In one exemplary embodiment, each Topological seed/blocking layer (Seed/BL) providing texturing Seed and blocking layer forming the epitaxial structure and promoting desired crystalline orientation and blocking diffusion of the Topological layer of an exemplary embodiment comprises Cr, Ta, Ru, Ir, Pt, W, Zr, Al, Ni, Co, Hf, MgO, $HfO_2$, or combinations thereof.

In one exemplary embodiment, Topological layer may include but not limited to a Topological half Heusler alloy (THHA) or a Topological insulator (TI) or a mixture of THHA and TI layer. In one exemplary embodiment, each corresponding Topological layer (SOT THHA) comprises Topological Half Heusler Alloy (THHA) APtBi, wherein A comprises Y, Lu. In another exemplary embodiment, each corresponding Topological layer (SOT THHA) comprises Topological Half Heusler Alloy (THHA) BPdBi, wherein B comprises Y, Sm, Gd, Tb, Dy, Ho, Er, Tm, Lu. In another exemplary embodiment, each corresponding Topological layer (TI SOT) of yet another exemplary embodiment comprises Topological Insulator (TI) bismuth antimony BiSb and its compound CBiSb, wherein C comprises Ni.

In one exemplary embodiment, Topological layer of yet another exemplary embodiment comprising doping or cluster co-depositing with ceramic elements including nitride, carbide, and oxide, or doping or cluster co-depositing with inert gases including $N_2$, $CO_2$, and $O_2$ to prevent diffusion/migration and improve the melting temperature of THHA and TI materials therefore to improve the thermal and long-term reliability thus its operating temperature of the devices.

In one exemplary embodiment, each corresponding SOT cell comprises Topological seed/blocking layer (Seed/BL) and Topological layer of an exemplary embodiment comprising laminated multilayer stack of Topological seed/blocking layer, un-doped Topological layer, and nitride, carbide and oxide doped or cluster co-deposited or/and $N_2$, $CO_2$, and $O_2$ doped or cluster co-deposited Topological layer, wherein the stack repeats one or more times, and each corresponding doped and un-doped Topological layer of an exemplary embodiment comprising a Topological half Heusler alloy (THHA) or a Topological insulator (TI) or a mixture of THHA and TI layer.

FIG. 6 is a schematic illustration of cross-sectional view of an exemplary embodiment of a SOT MRAM Unit Cell having Perpendicular Magnetic Anisotropy (PMA) MTJ, wherein each corresponding p-MTJ cell comprises tunneling magnetoresistance (TMR) stack of an exemplary embodiment of seed layer/data storage layer1/Ru/data storage layer2/MgO/pin layer1/Ru/pin layer2/PMA layer/cap layer comprising Perpendicular Magnetic Anisotropy (PMA) layer comprises CrMo, FePt, CoPt, or combination; pin layer PL1/pin layer PL2 comprises CoFeB, CoFe/NiFe, Ta, CoHf, or combination; Ru thickness comprises 2-10 A; data storage layer SL1/data storage layer SL2 providing magnetic data storage comprises CoFeB, CoFe/NiFe, Ta, MgO, W, CoHf, CoFe/Ru/CoFe, CoFe/W/CoFe or combination and SAF; MgO Barrier layer comprises crystalline orientation (001), thickness 2-40 A, and device resistant 100-1000 Ohm; cap/seed/blocking layer (BL) providing texture and blocking diffusion to improve TMR ratio and Topological Hall effect comprises Ta, Ru, Zr, Al, Ni, Co, Hf, MgO, or combinations thereof.

Each corresponding SOT-MTJ cell comprises 3 terminals: the writing is done by applied current between T1 and T2, to switch MTJ TMR SL the parallel and antiparallel states (referred to PL) by the SOT THHA layer; the reading is done by the TMR between T1 and T3; and the T1, T2, and T3 terminals are metal lines comprising Al, Cu, and W, wherein Al, Cu, and W metal interconnection vias and lines form through photoresistor plating process or Damascene process.

While the foregoing is directed to embodiments of the present disclosure, other and further embodiments of the disclosure may be devised without departing from the basic scope thereof, and the scope thereof is determined by the claims that follow.

What is claimed is:

1. An apparatus and a fabricating method therefor of the magnetic Topological Half-Heusler Alloy (THHA) and Topological Insulator (TI) based SOT-MTJ array unit cell comprising magnetic in-memory computing AI inference chips that comprises:

a. a spin orbit torque (SOT) cell configured from Topological seed/blocking layer and Topological layer stack;

b. a magnetic tunnel junction (MTJ) cell configured from tunneling magnetoresistance (TMR) layer stack;

c. and a fabricating method therefor comprising materials and manufacturable processes providing a SOT-MTJ cell configured the MTJ cell having AP-pinned data storage layer and adjustable MTJ junction shape, and the SOT cell having laminated multilayer stack of Topological seed/blocking layer and Topological layer, wherein:

d. the SOT Topological layer and MTJ data storage layer are configured to generate memory writing;

e. the MTJ TMR data storage layer/MgO/pin layer is configured to provide memory reading;

f. and together a magnetic chip comprising SOT-MTJ cells configuring a non-volatile memory array to store a corresponding programmable weight matrix provides AI in-memory computing.

2. A method of claim 1 for fabricating a SOT-MTJ cell configuring a corresponding magnetic in-memory computing AI inference chips of an exemplary embodiment comprising:

a. providing a TMR full film deposition having seed layer/AFM/pin layer1/Ru/pin layer2/blocking layer/MgO/data storage layer/cap layer, wherein data storage layer which is data storage layer having an anti-parallel pinned (AP-pinned) data storage layer1/Ru/data storage layer2;
b. providing a TMR MTJ hard mask including hard mask patterning through lithography and RIE;
c. providing a MTJ patterning Ion Mill, through pin layer/MgO/data storage layer;
d. providing a dielectric material refill, CMP with CMP Stop Layer, and Ion Mill with End Point to final cap surface;
e. providing a Topological SOT layer including seed/blocking layer deposition, Topological layer full film deposition, patterning through lithography and Ion Mill, dielectric film refill, and CMP.

3. A method of claim 1 for fabricating a SOT-MTJ cell configuring a corresponding magnetic in-memory computing AI inference chips of an exemplary embodiment comprising:

a. providing a Topological SOT layer including seed/blocking layer deposition, Topological layer full film deposition, patterning through lithography and Ion Mill, dielectric film refill, and CMP;
b. providing a MTJ TMR full film deposition having seed layer/data storage layer/MgO/pin layer1/Ru/pin layer2/AFM/cap layer, wherein data storage layer has an anti-parallel pinned (AP-pinned) data storage layer1/Ru/data storage layer2;
c. providing a TMR MTJ hard mask including hard mask patterning through lithography and RIE;
d. providing a MTJ patterning Ion Mill, through data storage layer/MgO/pin layer;
e. providing a dielectric material refill, CMP with CMP Stop Layer, and Ion Mill with End Point to final cap surface.

4. A method of claim 1 for fabricating a SOT-MTJ cell configuring a corresponding magnetic in-memory computing AI inference chips of an exemplary embodiment comprising:

a. providing a Topological SOT layer including seed/blocking layer deposition, Topological layer full film deposition, patterning through lithography and Ion Mill, dielectric film refill, and CMP;
b. providing a MTJ TMR full film deposition having seed layer/data storage layer/MgO/pin layer1/Ru/pin layer2/AFM/cap layer, wherein data storage layer has an anti-parallel pinned (AP-pinned) data storage layer1/Ru/data storage layer2;
c. providing a TMR MTJ hard mask including hard mask patterning through lithography and RIE;
d. providing a MTJ patterning RIE and stop on MgO;
e. providing a data storage layer length patterning through lithography and Ion Mill, wherein the data storage layer length is not aligned with the pin layer length;
f. providing a dielectric material refill, CMP with CMP Stop Layer, and Ion Mill with End Point to final cap surface.

5. The apparatus of claim 1, wherein each corresponding MTJ cell comprises tunneling magnetoresistance (TMR) stack of an exemplary embodiment of seed layer/data storage layer1/Ru/data storage layer2/MgO/pin layer1/Ru/pin layer2/AFM/cap layer comprising:

a. AFM comprises PtMn, IrMn, FeMn, CoPt, or combination;
b. pin layer PL1/pin layer PL2 comprises CoFeB, CoFe/NiFe, Ta, CoHf, or combination;
c. Ru thickness comprises 2-10 A;
d. data storage layer SL1/data storage layer SL2 providing magnetic data storage comprises CoFeB, CoFe/NiFe, Ta, MgO, W, CoHf, CoFe/Ru/CoFe, CoFe/W/CoFe or combination and SAF;
e. MgO Barrier layer comprises crystalline orientation (001), thickness 2-40 A, and device resistant 100-1000 Ohm;
f. cap/seed/blocking layer (BL) providing texture and blocking diffusion to improve TMR ratio and Topological Hall effect comprises Ta, Ru, Zr, Al, Ni, Co, Hf, MgO, or combinations thereof.

6. The apparatus of claim 1, wherein each corresponding MTJ cell comprises tunneling magnetoresistance (TMR) stack of an exemplary embodiment of seed layer/data storage layer1/Ru/data storage layer2/MgO/pin layer1/Ru/pin layer2/PMA layer/cap layer comprising:

a. Perpendicular Magnetic Anisotropy (PMA) layer comprises CrMo, FePt, CoPt, or combination;
b. pin layer PL1/pin layer PL2 comprises CoFeB, CoFe/NiFe, Ta, CoHf, or combination;
c. Ru thickness comprises 2-10 A;
d. data storage layer SL1/data storage layer SL2 providing magnetic data storage comprises CoFeB, CoFe/NiFe, Ta, MgO, W, CoHf, CoFe/Ru/CoFe, CoFe/W/CoFe or combination and SAF;
e. MgO Barrier layer comprises crystalline orientation (001), thickness 2-40 A, and device resistant 100-1000 Ohm;
f. cap/seed/blocking layer (BL) providing texture and blocking diffusion to improve TMR ratio and Topological Hall effect comprises Ta, Ru, Zr, Al, Ni, Co, Hf, MgO, or combinations thereof.

7. A method of claim 1, wherein each corresponding TMR MTJ having side gap layer providing side stress and isolation of an exemplary embodiment comprising MgO, Al2O3, SiC, Si3N4, SiO2, SiOxNy, HfO2, or combinations thereof.

8. The apparatus of claim 1, wherein each corresponding SOT cell comprises the Topological layer of an exemplary embodiment comprising Topological Half Heusler Alloy (THHA) APtBi, wherein A comprises Y, Lu.

9. The apparatus of claim 1, wherein each corresponding SOT cell comprises Topological layer of another exemplary embodiment comprising Topological Half Heusler Alloy (THHA) BPdBi, wherein B comprises Y, Sm, Gd, Tb, Dy, Ho, Er, Tm, Lu.

10. The apparatus of claim 1, wherein each corresponding SOT cell comprises Topological layer of yet another exemplary embodiment comprising Topological Insulator (TI) bismuth antimony BiSb and its compound CBiSb, wherein C comprises Ni.

11. The apparatus of claim 1, wherein each corresponding SOT cell comprises Topological layer of yet another exemplary embodiment comprising doping or cluster co-depositing with ceramic elements including nitride, carbide, and oxide, or doping or cluster co-depositing with inert gases including N2, CO2, and O2 to prevent diffusion/migration and improve the melting temperature of THHA and TI materials therefore to improve the thermal and long-term reliability thus its operating temperature of the devices.

12. The apparatus of claim 1, wherein each corresponding SOT cell comprises Topological seed/blocking layer providing texturing and blocking layer forming the epitaxial structure and promoting desired crystalline orientation and blocking diffusion of the Topological layer of an exemplary embodiment comprising Cr, Ta, Ru, Ir, Pt, W, Zr, Al, Ni, Co, Hf, MgO, HfO2, or combinations thereof.

13. The apparatus of claim 1, wherein each corresponding SOT cell comprises Topological seed/blocking layer and Topological layer of an exemplary embodiment comprising a laminated multilayer stack of Topological seed/blocking layer and Topological layer, wherein the stack repeats one or more times.

14. The apparatus of claim 12, wherein each corresponding laminated multilayer stack of Topological seed/blocking layer and Topological layer of an exemplary embodiment comprises Topological seed/blocking layer, un-doped Topological layer, and nitride, carbide and oxide doped or cluster co-deposited or/and N2, CO2, and 02 doped or cluster co-deposited Topological layer, wherein the stack repeats one or more times.

15. The apparatus of claim 13, wherein each corresponding doped and un-doped Topological layer of an exemplary embodiment comprising a Topological half Heusler alloy (THHA) or a Topological insulator (TI) or a mixture of THHA and TI layer.

16. The apparatus of claim 1, wherein each corresponding SOT-MTJ cell comprises 3 terminals:

a. the writing is done by applied current between T1 and T2, to switch MTJ TMR SL the parallel and antiparallel states (referred to PL) by the SOT Topological layer;
b. the reading is done by the TMR between T1 and T3;
c. and the T1, T2, and T3 terminals are metal lines comprising Al, Cu, and W, wherein Al, Cu, and W metal interconnection vias and lines form through photoresistor plating process or Damascene process.

* * * * *